(12) United States Patent
Soga

(10) Patent No.: US 10,348,285 B2
(45) Date of Patent: Jul. 9, 2019

(54) DETECTOR CIRCUIT AND WIRELESS COMMUNICATION APPARATUS

(71) Applicant: FUJITSU LIMITED, Kawasaki-shi, Kanagawa (JP)

(72) Inventor: Ikuo Soga, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/106,566

(22) Filed: Aug. 21, 2018

(65) Prior Publication Data
US 2019/0068180 A1 Feb. 28, 2019

(30) Foreign Application Priority Data
Aug. 23, 2017 (JP) ................. 2017-160088

(51) Int. Cl.
| H03K 5/08 | (2006.01) |
| H03K 5/26 | (2006.01) |
| H03F 3/21 | (2006.01) |
| H03F 3/19 | (2006.01) |
| H03K 5/24 | (2006.01) |

(52) U.S. Cl.
CPC ................. *H03K 5/26* (2013.01); *H03F 3/19* (2013.01); *H03F 3/211* (2013.01); *H03K 5/082* (2013.01); *H03K 5/2481* (2013.01)

(58) Field of Classification Search
None
See application file for complete search history.

(56) References Cited

U.S. PATENT DOCUMENTS

| 7,786,797 | B2* | 8/2010 | Okazaki | H03F 1/0288 330/124 R |
| 8,577,312 | B2* | 11/2013 | Magoon | H03G 3/3047 455/126 |
| 10,184,973 | B2* | 1/2019 | Nobbe | H03F 1/56 |
| 2005/0104628 | A1 | 5/2005 | Tanzawa et al. | |
| 2008/0174356 | A1 | 7/2008 | Yamamoto et al. | |

FOREIGN PATENT DOCUMENTS

| JP | 2005-151331 | 6/2005 |
| JP | 2008-148214 | 6/2008 |

* cited by examiner

*Primary Examiner* — Jeffery S Zweizig
(74) *Attorney, Agent, or Firm* — Fujitsu Patent Center

(57) ABSTRACT

A detector circuit includes a first inverter including an input node coupled via a first capacitor to a transmission path for transmitting an AC signal, the first inverter outputting an output voltage in accordance with power of the AC signal, wherein the output voltage increases with increasing temperature, a second inverter including an input node coupled to the transmission path, the second inverter outputting an output voltage in accordance with power of the AC signal, wherein the output voltage decreases with increasing temperature, a third capacitor including one electrode coupled to either an output electrode of the first inverter or an output node of the second inverter, a first resistor coupled between the output node of the first inverter and an output node of the detector circuit, and a second resistor coupled between the output node of the second inverter and the output node of the detector circuit.

10 Claims, 10 Drawing Sheets

DETECTOR CIRCUIT AND WIRELESS COMMUNICATION APPARATUS

CROSS-REFERENCE TO RELATED APPLICATION

This application is based upon and claims the benefit of priority of the prior Japanese Patent Application No. 2017-160088, filed on Aug. 23, 2017, the entire contents of which are incorporated herein by reference.

FIELD

The embodiment discussed herein is related to a detector circuit and a wireless communication apparatus.

BACKGROUND

In a wireless communication apparatus, to achieve normal communication, the power of alternating current (AC) signals, such as modulated signals and demodulated signals, that are input and output within the apparatus is detected, and control is performed in accordance with detection results. To detect the power of an AC signal, for example, a detector circuit is used. FIG. 10A illustrates an example of a configuration of an existing detector circuit that uses a diode as a rectifier element. The detector circuit illustrated in FIG. 10A includes capacitors 1001 and 1005, an inductor 1002, a diode 1003, a resistor 1004, and a direct-current (DC) voltage source 1006.

One electrode of the capacitor 1001 is coupled to a transmission path for transmitting an AC signal to be detected, and the other electrode is coupled to the anode of the diode 1003. One end of the inductor 1002 is coupled to the anode of the diode 1003, and the other end is coupled to the DC voltage source 1006. The cathode of the diode 1003 is coupled to a node that outputs an output voltage VOUT. One end of the resistor 1004 is coupled to the cathode of the diode 1003, and the other end is coupled to a reference potential (for example, the ground). One electrode of the capacitor 1005 is coupled to the cathode of the diode 1003, and the other electrode is coupled to the reference potential.

An AC signal biased by a bias voltage generated by the capacitor 1001, the inductor 1002, and the DC voltage source 1006 is input to the anode of the diode 1003. The diode 1003 rectifies the AC signal input to its anode to output a signal (voltage) in accordance with the power of the input AC signal. The high-frequency component of the signal (voltage) output from the cathode of the diode 1003 is removed by a low-pass filter including the capacitor 1005 and the resistor 1004, and the resultant signal is output as an output voltage VOUT. In such a way, the detector circuit illustrated in FIG. 10A outputs a DC voltage signal as the output voltage VOUT in accordance with the power of an input AC signal.

The detector circuit illustrated in FIG. 10A exhibits temperature characteristics as illustrated in FIG. 10B due to the temperature characteristics of the diode 1003. FIG. 10B is a diagram illustrating temperature characteristics of the detector circuit illustrated in FIG. 10A, and the horizontal axis represents power Pin of an AC signal that is input and the vertical axis represents the output voltage VOUT. FIG. 10B illustrates characteristics 1011 at a temperature T11, characteristics 1012 at a temperature T12, characteristics 1013 at a temperature T13, characteristics 1014 at a temperature T14, and characteristics 1015 at a temperature T15. The temperatures T11 to T15 are such that T11 (low temperature) <T12<T13<T14<T15 (high temperature).

As illustrated in FIG. 10B, when AC signals with the same power Pin are input, the output voltages VOUT of the detector circuit differ depending on temperature, such that the higher the temperature, the higher the output voltage VOUT. In a detector circuit using a diode in such a manner, the output voltage VOUT varies with temperature change. The temperature of the wireless communication apparatus varies and is not fixed because of heat generation inside the housing or environmental temperature, and therefore it is difficult to accurately detect the power of an AC signal.

The followings are reference documents.
[Document 1] Japanese Laid-open Patent Publication No. 2005-151331 and
[Document 2] Japanese Laid-open Patent Publication No. 2008-148214.

SUMMARY

According to an aspect of the invention, a detector circuit includes a first inverter including an input node coupled via a first capacitor to a transmission path for transmitting an AC signal, the first inverter outputting an output voltage in accordance with power of the AC signal, wherein the output voltage increases with increasing temperature, a second inverter including an input node coupled via a second capacitor to the transmission path, the second inverter outputting an output voltage in accordance with power of the AC signal, wherein the output voltage decreases with increasing temperature, a third capacitor including one electrode coupled to either an output electrode of the first inverter or an output node of the second inverter, a first resistor coupled between the output node of the first inverter and an output node of the detector circuit, and a second resistor coupled between the output node of the second inverter and the output node of the detector circuit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Hereinafter, an embodiment of the present disclosure will be described with reference to the accompanying drawings.

Figure 1A:
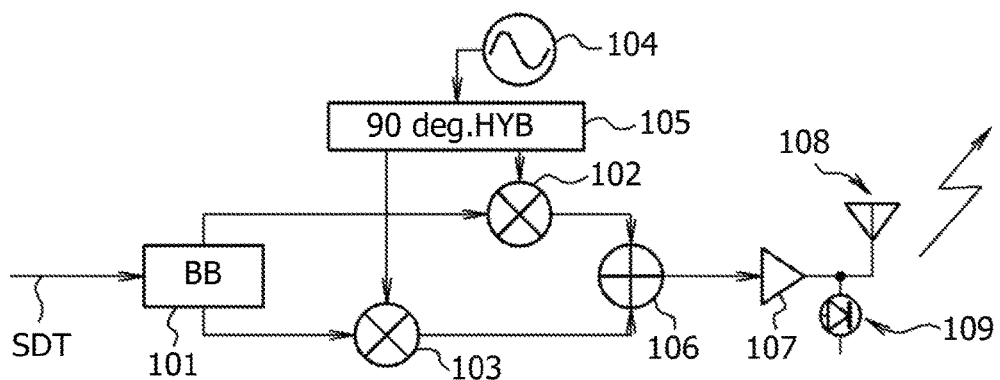
FIG. 1A and FIG. 1B are diagrams illustrating an example of a configuration of a wireless communication apparatus in an embodiment of the present disclosure.
Figure 1B:
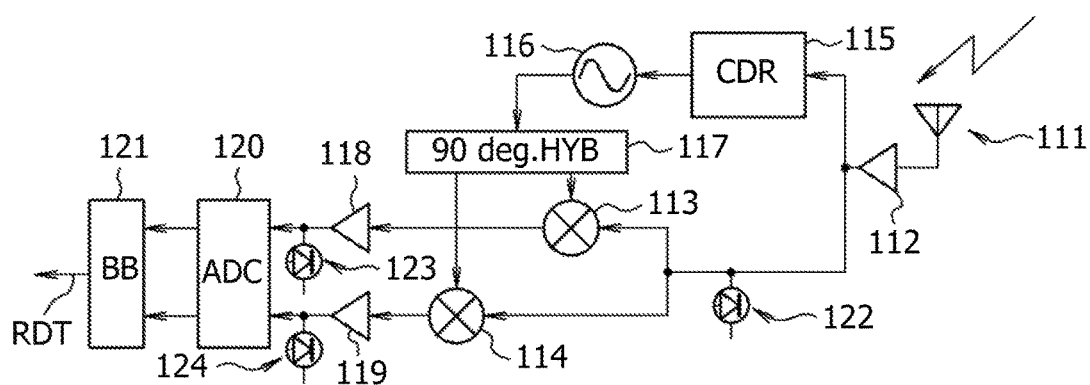

FIG. 1A and FIG. 1B are diagrams illustrating an example of a configuration of a wireless communication apparatus including detector circuits in an embodiment of the present disclosure. FIG. 1A and FIG. 1B illustrate, by way of example, a configuration of a wireless communication apparatus of a quadrature phase shift keying (QPSK) scheme using a carrier-wave method; the configuration of a transmitting unit is illustrated in FIG. 1A and the configuration of a receiving unit is illustrated in FIG. 1B.

The transmitting unit (transmitter) of the wireless communication apparatus illustrated in FIG. 1A includes a baseband processing circuit 101, multipliers (mixers) 102 and 103, a local oscillator 104, a 90-degree hybrid circuit 105, an adder 106, a power amplifier (PA) 107, and an antenna 108. The baseband processing circuit 101 generates an intermediate frequency (IF) signal based on send data SDT that is input from a digital processing circuit or the like, which is not illustrated, and outputs the IF signal.

The multipliers 102 and 103 mix the IF signal output from the baseband processing circuit 101 with a local oscillating signal generated and output by the local oscillator 104. That is, the multipliers 102 and 103 upconvert the IF signal from the baseband processing circuit 101 by using the local oscillating signal to generate a radio-frequency (RF) signal. Here, local oscillating signals from the local oscillator 104 are supplied via the 90-degree hybrid circuit 105 to the multipliers 102 and 103 such that the local oscillating signal that is supplied to the multiplier 102 and the local oscillating signal that is supplied to the multiplier 103 are 90 degrees out of phase.

The RF signals generated by the multipliers 102 and 103 are added together and are output to the power amplifier 107 by the adder 106. The power amplifier 107 amplifies the transmit power of the RF signal output from the adder 106 and inputs the RF signal with the amplified transmit power to the antenna 108. The antenna 108 transmits the RF signal input by the power amplifier 107.

In the transmitting unit of the wireless communication apparatus illustrated in FIG. 1A, for example, the detector circuit 109 in the present embodiment is coupled between the power amplifier 107 and the antenna 108, and the detector circuit 109 detects the power of an AC signal that has been output from the power amplifier 107 and is to be input to the antenna 108. That is, the detector circuit 109 detects the power of an RF signal whose transmit power has been amplified by the power amplifier 107. For example, based on a detection result with the detector circuit 109, it is possible to detect the final output power of the antenna 108 and to control the power amplifier 107 so that the output power of the antenna 108 is at a desired level.

The receiving unit (receiver) of the wireless communication apparatus illustrated in FIG. 1B includes an antenna 111, a low noise amplifier (LNA) 112, multipliers (mixers) 113 and 114, a clock and data recovery circuit 115, a local oscillator 116, a 90-degree hybrid circuit 117, limiter amplifiers 118 and 119, an analog-to-digital converter 120, and a baseband processing circuit 121.

The low noise amplifier 112 amplifies an RF signal received by the antenna 111 to a desired level and outputs the amplified RF signal. The multipliers 113 and 114 each mix the RF signal output from the low noise amplifier 112 with a local oscillating signal generated and output by the local oscillator 116. That is, the multipliers 113 and 114 each downconvert the received RF signal with the local oscillating signal to generate an IF signal. The multipliers 113 and 114 are examples of a demodulation circuit.

The clock and data recovery circuit 115 controls the phase of a local oscillating signal output by the local oscillator 116, based on the received RF signal. In addition, local oscillating signals from the local oscillator 116 are supplied via the 90-degree hybrid circuit 117 to the multipliers 113 and 114 such that the local oscillating signal that is supplied to the multiplier 113 and the local oscillating signal that is supplied to the multiplier 114 are 90 degrees out of phase.

The limiter amplifier 118 amplifies an IF signal output from the multiplier 113 and outputs the amplified IF signal. The limiter amplifier 119 also amplifies an IF signal output from the multiplier 114 and outputs the amplified IF signal. The analog-to-digital converter 120 analog-to-digital converts the analog IF signals output from the limiter amplifiers 118 and 119 into digital data. The baseband processing circuit 121 generates receive data RDT based on the digital data obtained by conversion by the analog-to-digital converter 120 and outputs the receive data RDT to a digital processing circuit or the like, which is not illustrated.

In the receiving unit of the wireless communication apparatus illustrated in FIG. 1B, for example, a detector circuit 122 in the present embodiment is coupled between the low noise amplifier 112 and the multipliers 113 and 114, and the detector circuit 122 detects the power of an AC signal that has been output from the low noise amplifier 112 and is to be input to the multipliers 113 and 114. That is, the detector circuit 122 detects the power of the RF signal amplified by the low noise amplifier 112. For example, based on a detection result with the detector circuit 122, it is possible to detect the level of power of the received RF signal.

In addition, for example, a detector circuit 123 or 124 in the present embodiment is coupled between the limiter amplifier 118 or 119 and the analog-to-digital converter 120, and the detector circuit 123 or 124 detects the power of an AC signal that has been output from the limiter amplifier 118 or 119 and is to be input to the analog-to-digital converter 120. That is, the detector circuit 123 detects the power of an IF signal amplified by the limiter amplifier 118, and the detector circuit 124 detects the power of an IF signal amplified by the limiter amplifier 119. For example, based on a detection result with the detector circuit 123 or 124, it is possible to detect the level of power of a signal when the signal has been demodulated and has become a signal of data, and to control the limiter amplifier 118 or 119 and the analog-to-digital converter 120 so as to suitably perform analog-to-digital conversion or the like.

Figure 2A:
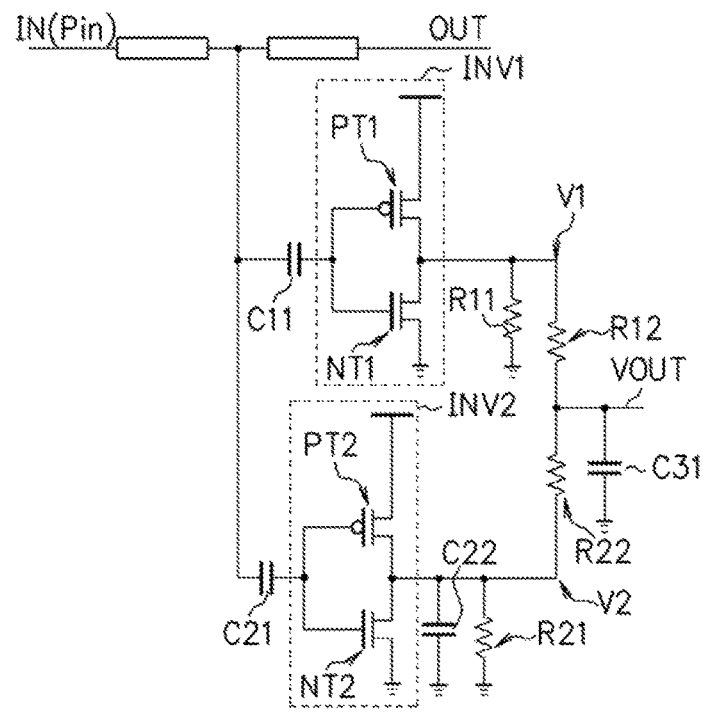
FIG. 2A is a diagram illustrating an example of a configuration of a detector circuit in the present embodiment.

FIG. 2A is a diagram illustrating an example of a configuration of a detector circuit in the present embodiment. The detector circuit is coupled to a transmission path, through which an AC signal is transmitted from a node IN to a node OUT, to detect the power of an AC signal, and outputs the output voltage VOUT in accordance with the power of the input AC signal. The detector circuit includes inverters INV1 and INV2, capacitors C11, C21, C22, and C31, and resistors R11, R12, R21, and R22.

The inverter INV1 is a complementary metal oxide semiconductor (CMOS) inverter including a P-channel thin film transistor (a P-channel TFT, hereinafter referred to as a "P-channel transistor") PT1 and an N-channel thin film transistor (an N-channel TFT, hereinafter referred to as an "N-channel transistor") NT1. The source of the P-channel transistor PT1 is coupled to a power supply voltage, the source of the N-channel transistor NT1 is coupled to the reference potential (the ground level), and the drain of the P-channel transistor PT1 and the drain of the N-channel transistor NT1 are coupled together.

In addition, the gate of the P-channel transistor PT1 and the gate of the N-channel transistor NT1 are coupled to one electrode of the capacitor C11 the other electrode of which is coupled to the transmission path for transmitting an AC signal to be detected. That is, the input node of the inverter INV1 is AC coupled via the capacitor C11 for AC coupling to the transmission path for transmitting an AC signal to be detected, and input to the inverter INV1 is DC cut.

One end of the resistor R11 is coupled to an interconnection point of the drain of the P-channel transistor PT1 and the drain of the N-channel transistor NT1, and the other end is coupled to the reference potential. One end of the resistor R12 is coupled to the interconnection point of the drain of the P-channel transistor PT1 and the drain of the N-channel transistor NT1, and the other end is coupled to a node that outputs the output voltage VOUT. That is, the output node of the inverter INV1 is coupled via the resistor R11 to the reference potential and is coupled via the resistor R12 to the output node of the output voltage VOUT.

In addition, the inverter INV2 is a CMOS inverter including the P-channel transistor PT2 and the N-channel transistor NT2. The source of the P-channel transistor PT2 is coupled to the power supply voltage, the source of the N-channel transistor NT2 is coupled to the reference potential, and the drain of the P-channel transistor PT2 and the drain of the N-channel transistor NT2 are coupled together.

In addition, the gate of the P-channel transistor PT2 and the gate of the N-channel transistor NT2 are coupled to one electrode of the capacitor C21 the other end of which is coupled to the transmission path for transmitting an AC signal to be detected. That is, the input node of the inverter INV2 is coupled via the capacitor C21 for AC coupling to the transmission path for transmitting an AC signal to be detected, and input to the inverter INV2 is DC cut.

One electrode of the capacitor C22 is coupled to an interconnection point of the drain of the P-channel transistor PT2 and the drain of the N-channel transistor NT2, and the other electrode is coupled to the reference potential. One end of the resistor R21 is coupled to the interconnection point of the drain of the P-channel transistor PT2 and the drain of the N-channel transistor NT2, and the other end is coupled to the reference potential. One end of the resistor R22 is coupled to the interconnection point of the drain of the P-channel transistor PT2 and the drain of the N-channel transistor NT2, and the other end is coupled to the node that outputs the output voltage VOUT. That is, the output node of the inverter INV2 is coupled via each of the capacitor C22 and the resistor R21 to the reference potential, and is coupled via the resistor R22 to the output node of the output voltage VOUT.

The capacitor C31, which is intended to stabilize the output of the detector circuit, includes one electrode coupled to the node that outputs the output voltage VOUT, and includes the other electrode coupled to the reference potential. Note that the resistor R12 or R22 has a resistance in accordance with the level of temperature characteristics of the inverter INV1 or INV2, in other words, a resistance at the same ratio as that of the output voltage variation of the inverter INV1 or INV2.

Figure 2B:
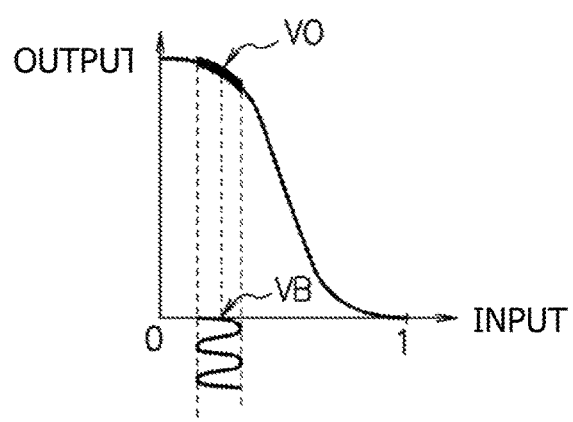
FIG. 2B is a diagram illustrating a rectifying function in the present embodiment.

In the detector circuit illustrated in FIG. 2A, the inverters INV1 and INV2 achieve the functions as rectifier elements. Input of the inverter INV1 or INV2 is biased with a voltage in accordance with a capacitance ratio or the like related to the gates of the P-channel transistor and N-channel transistor included in the inverter INV1 or INV2. For example, as illustrated by way of example in FIG. 2B, when an AC signal is input in the situation where input of the inverter INV1 or INV2 is biased with a voltage VB, the output of the inverter INV1 or INV2 is as denoted by VO, the functions as a rectifier element are achieved by the inverter INV1 or INV2.

Here, the two inverters INV1 and INV2 included in the detector circuit have different relationships in terms of which one of the P-channel transistor and the N-channel transistor included in each of the inverters INV1 and INV2 has a greater saturation current value than the other. In one of the inverters INV1 and INV2, the saturation current value of the P-channel transistor is greater than the saturation current value of the N-channel transistor. Conversely, in the other of the inverters INV1 and INV2, the saturation current value of the N-channel transistor is greater than the saturation current value of the P-channel transistor.

The saturation current values of the P-channel transistor and the N-channel transistor may be adjusted by using, for example, the gate widths of transistors. To make the saturation current value of the P-channel transistor to be greater than the saturation current value of the N-channel transistor, at least either the gate width of the P-channel transistor is made greater or the gate width of the N-channel transistor is made smaller as compared to the case where the saturation current value of the P-channel transistor and the saturation current value of the N-channel transistor are the same. Conversely, to make the saturation current value of the N-channel transistor to be greater than the saturation current value of the P-channel transistor, at least either the gate width of the P-channel transistor is made smaller or the gate width of the N-channel transistor is made greater as compared to the case where the saturation current value of the P-channel transistor and the saturation current value of the N-channel transistor are the same. Note that the adjustment is not limited to that using gate widths of transistors, and the saturation current values of transistors may be adjusted by using the gate lengths of transistors.

Figure 3:
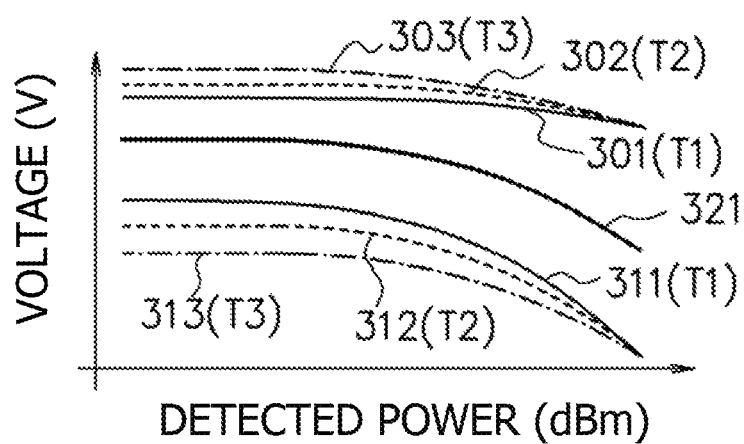
FIG. 3 is a diagram illustrating temperature characteristics of output voltages of inverters and output voltages of a detector circuit, in the present embodiment.

In this example, description will be given assuming that, in the inverter INV1, the saturation current value of the P-channel transistor PT1 is greater than the saturation current value of the N-channel transistor NT1, and, in the inverter INV2, the saturation current value of the N-channel transistor NT2 is greater than the saturation current value of the P-channel transistor PT2. At this point, the output voltage of the inverter INV1 exhibits characteristics as denoted by reference numerals 301 to 303 in FIG. 3, and the output voltage of the inverter INV2 exhibits characteristics as denoted by reference numerals 311 to 313 in FIG. 3. In FIG. 3, reference numerals 301 and 311 denote output voltages at a temperature T1, reference numerals 302 and 312 denote output voltages at a temperature T2 (T1<T2), and reference numerals 303 and 313 denote output voltages at a temperature T3 (T2<T3). Note that the horizontal axis represents the power of an AC current that is input to the inverters INV1 and INV2, and the vertical axis represents output voltage.

As illustrated in FIG. 3, the inverter INV1 produces an output voltage that increases with increasing temperature, and the inverter INV2 produces an output voltage that decreases with increasing temperature. That is, the temperature characteristics of output voltages of the inverters INV1 and INV2 relative to temperature change exhibit opposite characteristics. In addition, a capacitor is arranged for one of the output nodes of the inverters INV1 and INV2 and no capacitor is arranged for the other, which results in different variation ratios of output voltages of the inverters INV1 and INV2 relative to power variations of AC signals. Thereby, the output nodes of the inverters INV1 and INV2 are coupled together via the resistors R12 and R22 having resistances in accordance with the levels of temperature characteristics of the respective output voltages of the inverters INV1 and INV2, such that the potential between the resistors R12 and R22 does not have temperature characteristics, and the potential between the resistors R12 and R22, which is output as the output voltage VOUT of the detector circuit, exhibits characteristics as denoted by reference numeral 321 in FIG. 3. That is, the output voltage VOUT of the detector circuit, whose voltage variations relative to temperature change are suppressed, exhibits voltage variations in accordance with the power of an input AC signal.

Figure 4:
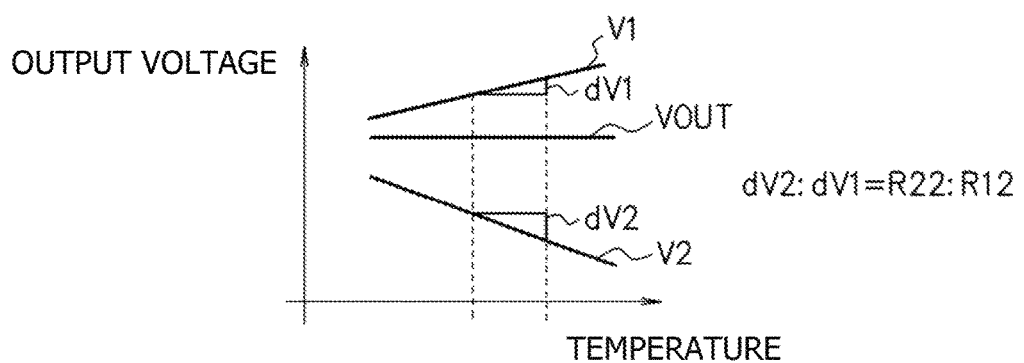
FIG. 4 is a diagram illustrating a method of calculating resistances in the present embodiment.

A calculation method for the resistors R12 and R22 will be described with reference to FIG. 4. In FIG. 4, V1 denotes the voltage (output voltage) of the output node V1 of the inverter INV1, V2 denotes the voltage (output voltage) of the output node V2 of the inverter INV2, and VOUT denotes the output voltage of the detector circuit. The horizontal axis represents temperature and the vertical axis represents output voltage.

The resistances of the resistors R12 and R22 are calculated by using, for example, an output voltage obtained when the power of an input AC signal has a small value. When the power of an input AC signal has a predetermined value, it is assumed that, for a certain amount of temperature change, the variation in the output voltage V1 of the inverter INV1 is dV1 and the variation in the output voltage V2 of the inverter INV2 is dV2. The resistances of the resistors R12 and R22 are set such that the ratio between these resistances is the same as the ratio between variations in the output voltages of the inverters INV1 and INV2, and thus the output voltage VOUT of the detector circuit is fixed, independent of temperature. Accordingly, resistances that satisfy the relationship of dV2:dV1=(resistance of the resistor R22):(resistance of the resistor R12) are calculated and are regarded as resistances of the resistors R12 and R22.

As described above, two inverters INV1 and INV2 having different relationships in terms of which one of the P-channel transistor and the N-channel transistor included in each of the inverters INV1 and INV2 has a greater saturation current value than the other are used as rectifier elements, and a capacitor and a resistor coupled to the reference potential are coupled to the output node of one of the inverters whereas not a capacitor but a resistor coupled to the reference potential is coupled to the output node of the other inverter. Further, the output nodes of the inverters INV1 and INV2 are coupled via two resistors, and the potential between the two resistors is output as the output voltage VOUT of the detector circuit. Thereby, variations in the output voltage VOUT of the detector circuit caused by temperature change may be reduced. Accordingly, a temperature-compensated detector circuit may be implemented and the power of an input AC signal may be detected accurately. In addition, the resistances of two resistors that couple the output nodes of the inverters INV1 and INV2 are set such that the resistances are in the same ratio as that of variations in the output voltages of the inverters INV1 and INV2, and thus variations in the output voltage VOUT of the detector circuit caused by temperature change may further be suppressed, and a further temperature-compensated detector circuit may be implemented.

Figure 5:
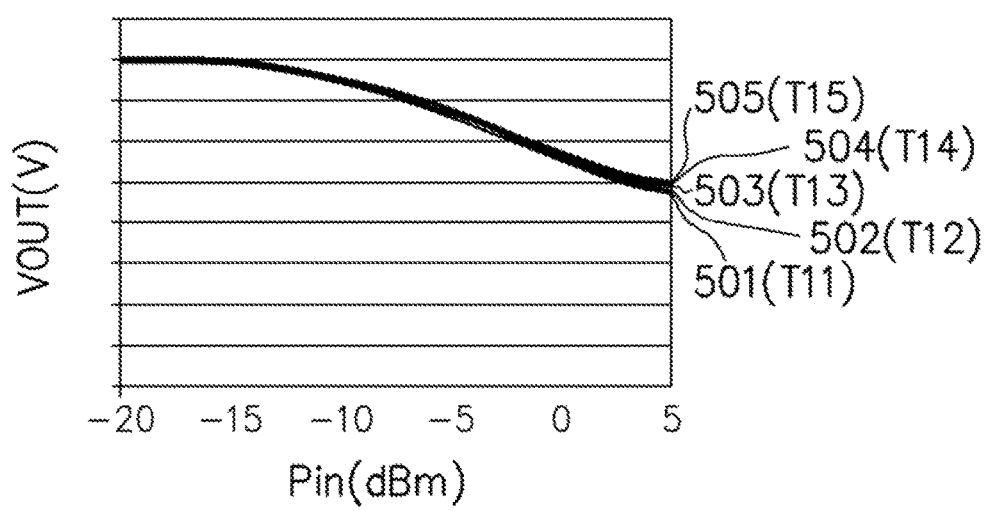
FIG. 5 is a diagram illustrating temperature dependence characteristics of output voltages of a detector circuit in the present embodiment.
Figure 6:
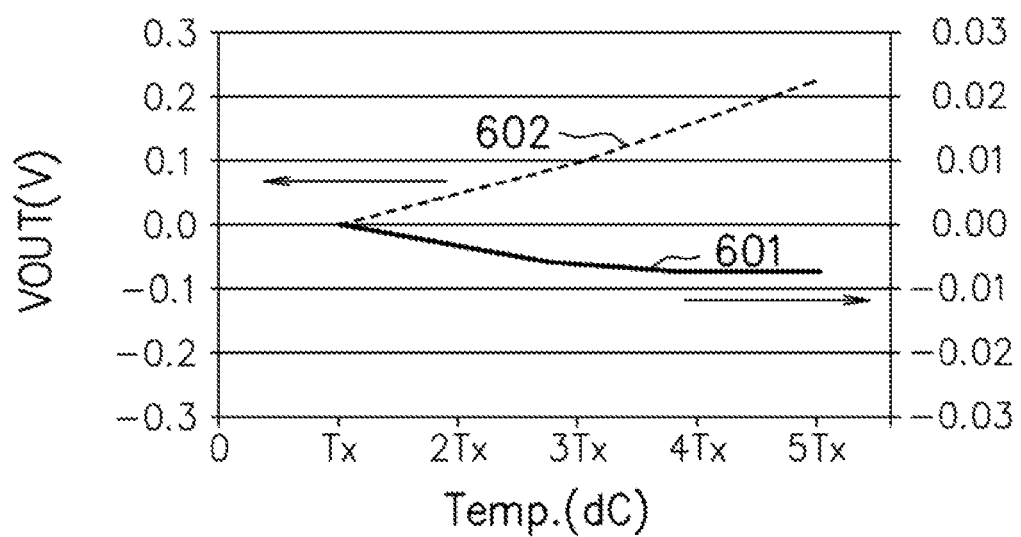
FIG. 6 is a diagram illustrating a variation in output voltage with temperature in the present embodiment.

For example, the output voltage of the detector circuit in the present embodiment exhibits temperature-dependent characteristics as illustrated in FIG. 5. FIG. 5 is a diagram illustrating temperature dependent characteristics of the output voltage of the detector circuit in the present embodiment, and the horizontal axis represents the power Pin of an input AC signal and the vertical axis represents the output voltage VOUT. FIG. 5 illustrates characteristics 501 at the temperature T11, characteristics 502 at the temperature T12, characteristics 503 at the temperature T13, characteristics 504 at the temperature T14, and characteristics 505 at the temperature T15. The temperatures T11 to T15 are such that T11 (low temperature)<T12<T13<T14<T15 (high temperature). As apparent from FIG. 5, even when temperature changes, the output voltage of the detector circuit in the present embodiment hardly varies. For example, when the power of an input AC current has a certain value, the variation in the output voltage of the detector circuit relative to temperature change is one-twentieth or less of that in the existing apparatus, as illustrated by way of example in FIG. 6. FIG. 6 is diagram illustrating variations in output voltages of detector circuits with temperature. With an existing detector circuit using a diode, a variation greater than 0.2 V is exhibited as indicated by a dotted line 602, whereas, with the detector circuit in the present embodiment, variations are less than or equal to 0.01 V as indicated by a solid line 601.

Note that, in the foregoing detector circuit illustrated in FIG. 2A, input of the inverter INV1 or INV2, that is, the gates of the P-channel transistor and the N-channel transistor thereof will be biased with voltages in accordance with capacitance ratio or the like related to the gates of the P-channel transistor and N-channel transistor included in the inverter INV1 or INV2. However, the detector circuit is not limited to this, and bias circuits that generate bias voltages may be arranged, for example, as illustrated in FIG. 7, such that input of the inverters INV1 and INV2 is biased to predetermined voltages.

Figure 7:
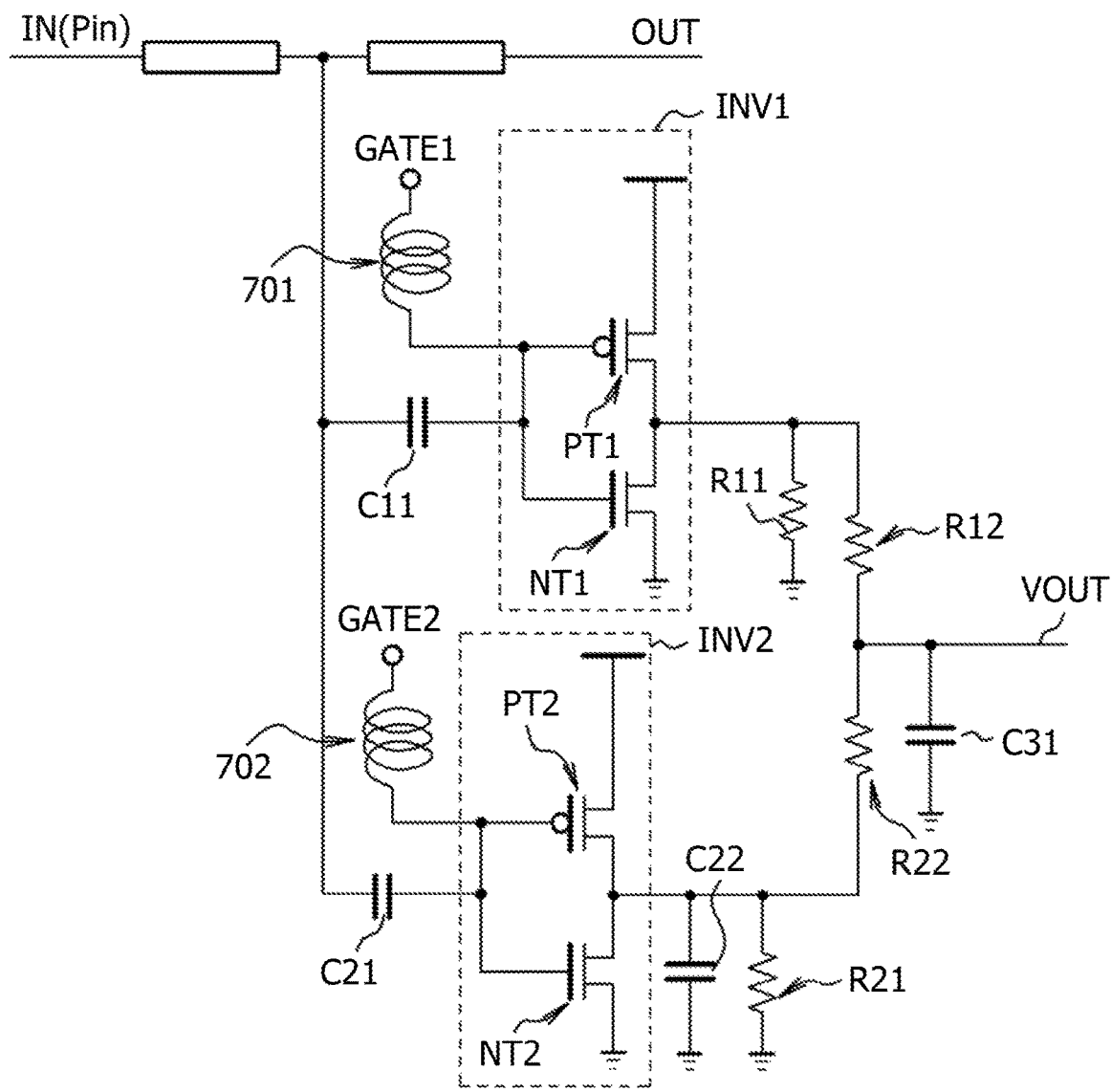
FIG. 7 is a diagram illustrating an example of another configuration of a detector circuit in the present embodiment.

FIG. 7 is a diagram illustrating an example of another configuration of a detector circuit in the present embodiment. In FIG. 7, components having the same functions as the components illustrated in FIG. 2A are denoted by the same reference characters, and overlapping description thereof is omitted. In the detector circuit illustrated in FIG. 7, the gates of the P-channel transistor PT1 and the N-channel transistor NT1 included in the inverter INV1 are coupled via the inductor 701 to a gate voltage GATE1. That is, input of the inverter INV1 is biased with a voltage based on the gate voltage GATE1.

In addition, the gates of the P-channel transistor PT2 and the N-channel transistor NT2 included in the inverter INV2 are coupled via the inductor 702 to a gate voltage GATE2. That is, input of the inverter INV2 is biased with a voltage based on the gate voltage GATE2. When bias circuits that generate bias voltages are arranged in such a manner to bias the input of the inverters INV1 and INV2, similar effects may be obtained.

Figure 8:
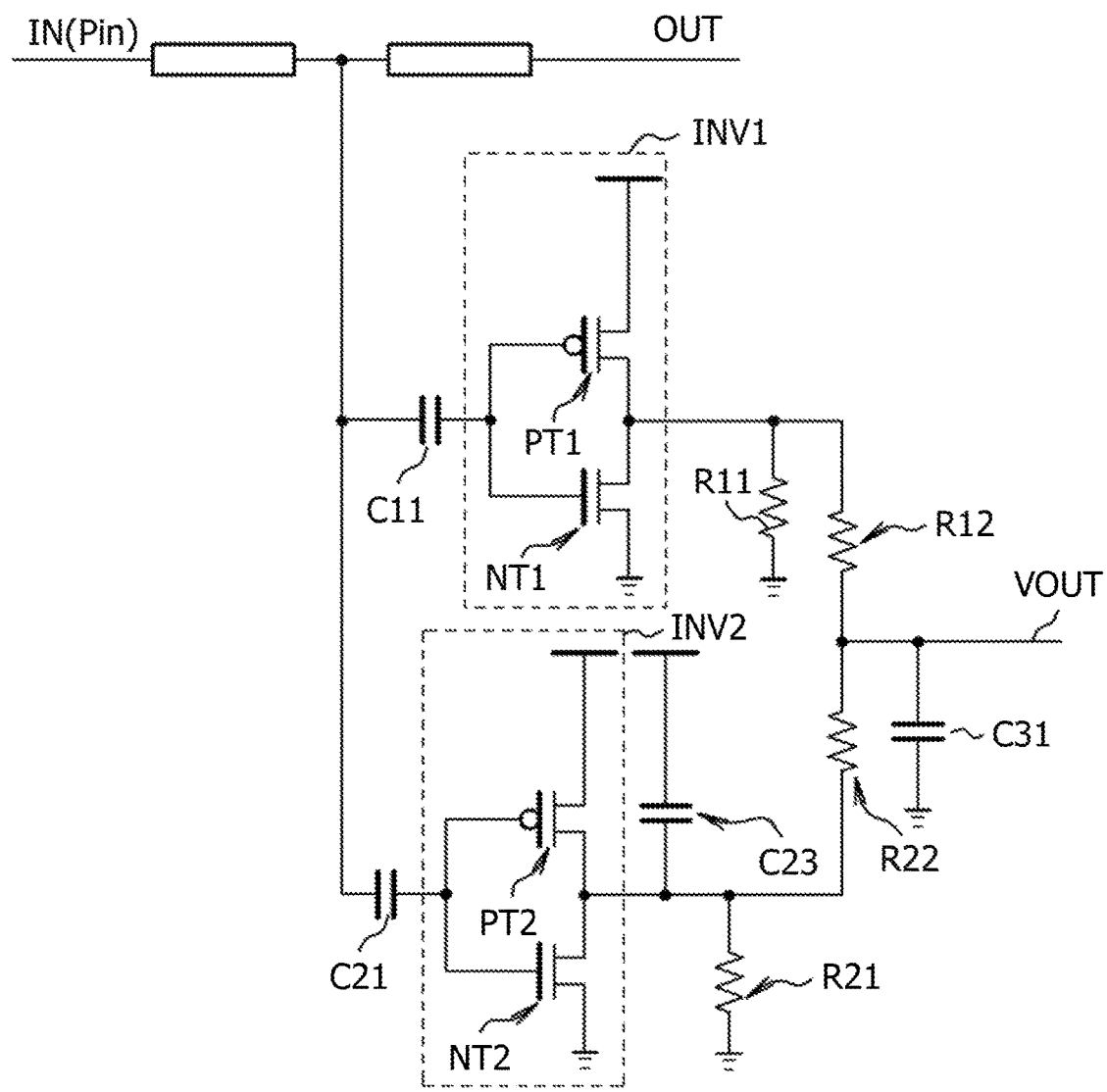
FIG. 8 is a diagram illustrating an example of another configuration of a detector circuit in the present embodiment.

In addition, although, in the foregoing detector circuit illustrated in FIG. 2A, a capacitor coupled to an interconnection point of the drain of the P-channel transistor PT2 and the drain of the N-channel transistor NT2 is coupled to the reference potential, the interconnection point being the output node of the inverter INV2, similar effects may be obtained when the capacitor is coupled to the power supply voltage as illustrated in FIG. 8.

FIG. 8 is a diagram illustrating an example of another configuration of a detector circuit in the present embodiment. In FIG. 8, components having the same functions as the components illustrated in FIG. 2A are denoted by the same reference characters, and overlapping description thereof is omitted. In the detector circuit illustrated in FIG. 8, a capacitor C23 includes one electrode coupled to the interconnection point of the drain of the P-channel transistor PT2 and the drain of the N-channel transistor NT2, and the other electrode thereof is coupled to the power supply voltage.

Note that although the wireless communication apparatus of a quadrature phase shift keying scheme has been illustrated as an example of a wireless communication apparatus including a detector circuit in the present embodiment, a detector circuit in the present embodiment is applicable to a wireless communication apparatus of another modulation scheme using a carrier-wave method. In addition, a detector circuit in the present embodiment is applicable not only to wireless communication apparatuses using carrier-wave methods but also wireless communication apparatuses using impulse methods.

Figure 9A:
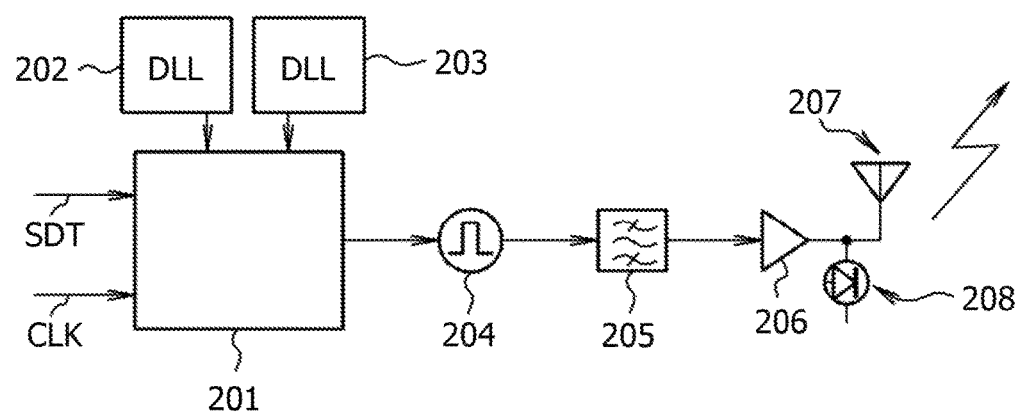
FIG. 9A and FIG. 9B are diagrams illustrating an example of another configuration of a wireless communication apparatus in the present embodiment.
Figure 9B:
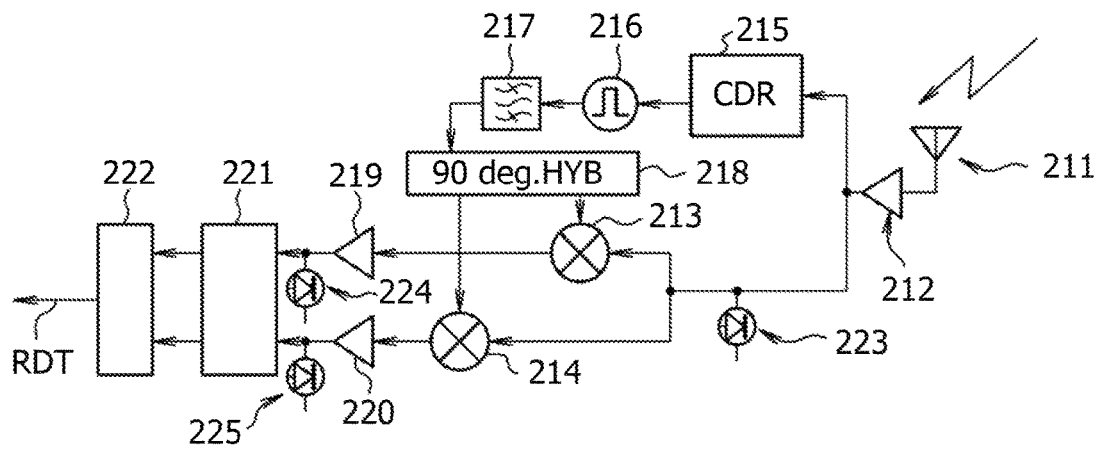
Figure 10A:
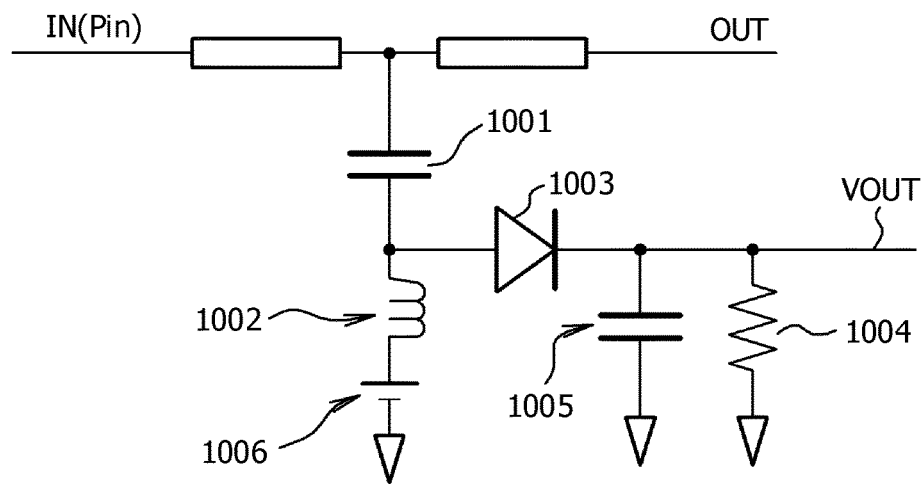
FIG. 10A is a diagram illustrating an example of a configuration of an existing detector circuit.
Figure 10B:
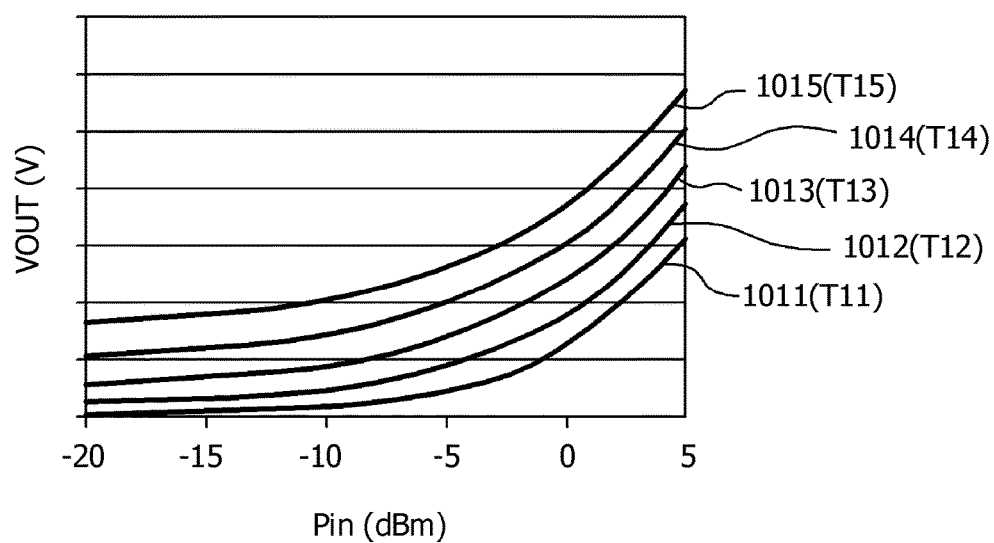
FIG. 10B is a diagram illustrating temperature characteristics of the detector circuit illustrated in FIG. 10A.

FIG. 9A and FIG. 9B are diagrams illustrating an example of a configuration of a wireless communication apparatus using an impulse method including a detector circuit in the present embodiment. FIG. 9A illustrates a configuration of a transmitting unit of the wireless communication apparatus, and FIG. 9B illustrates a configuration of a receiving unit of the wireless communication apparatus. Note that a wireless communication apparatus using an impulse method described below changes the placement positions (phases) of pulses in one symbol period in accordance with send data, thereby performing communication with a plurality of bits of information placed on one symbol.

A transmitting unit (transmitter) of the wireless communication apparatus illustrated in FIG. 9A includes a pulse-position modulation circuit 201, delay locked loop (DLL) circuits 202 and 203, a pulse generator 204, a bandpass filter 205, a power amplifier (PA) 206, and an antenna 207.

The pulse-position modulation circuit 201, to which send data SDT and a clock CLK are input, controls the placement positions of pulses within one symbol period in accordance with the send data SDT. For example, in the case where wireless communication is performed by using a frequency band (millimeter waveband) called E band of 71-76 GHz or 81-86 GHz, the pulse-position modulation circuit 201 temporally shifts the placement position (phase) of pulses to any of +6 ps (π), +3 ps (π/2), and 0 ps, and −3 ps (−π/2) in accordance with the send data SDT. The pulse-position modulation circuit 201 controls the placement position (phase) of pulses by using signals output from the delay locked loop circuits 202 and 203.

The pulse generator 204 generates narrow short pulses (impulses) at a timing in accordance with output of the pulse-position modulation circuit 201. The bandpass filter 205 applies bandwidth control in accordance with a frequency band used for wireless communication to short pulses generated by the pulse generator 204 to extract high-frequency components. The power amplifier 206 amplifies the transmit power of a signal output from the bandpass filter 205 and inputs the resultant signal to the antenna 207. The antenna 207 transmits the signal input by the power amplifier 206.

In the transmitting unit of the wireless communication apparatus illustrated in FIG. 9A, for example, the detector circuit 208 is coupled between the power amplifier 206 and the antenna 207, and the detector circuit 208 detects the power of an AC signal that has been output from the power amplifier 206 and is to be input to the antenna 207. That is, the detector circuit 206 detects the power of an AC signal whose transmit power has been amplified by the power amplifier 206.

The receiving unit (receiver) of the wireless communication apparatus illustrated in FIG. 9B includes an antenna 211, a low noise amplifier (LNA) 212, multipliers (mixers) 213 and 214, a clock and data recovery circuit 215, a pulse generator 216, a bandpass filter 217, a 90-degree hybrid circuit 218, limiter amplifiers 219 and 220, an analog-to-digital converter 221, and a baseband processing circuit 222.

The low noise amplifier 212 amplifies an RF signal received by the antenna 211 to a desired level and outputs the amplified signal. The multipliers 213 and 214 each mix the RF signal output from the low noise amplifier 212 with a pulse signal generated by the pulse generator 216 and the bandpass filter 217 to perform signal detection. Thereby, the multipliers 213 and 214 generate IF signals from the received RF signal. The multipliers 213 and 214 are examples of a demodulation circuit.

The clock and data recovery circuit 215 controls the generation timing (phase) of short pulses in the pulse generator 216 based on the received RF signal. The pulse generator 216 generates short pulses with a period similar to that of the pulse generator 204 of the transmitting unit. The bandpass filter 217 has bandpass characteristics similar to that of the bandpass filter 205 of the transmitting unit and extracts high-frequency components from short pulses generated by the pulse generator 216. Signals output from the bandpass filter 217 are suppled via the 90-degree hybrid circuit 218 to the multipliers 213 and 214, and the pulse signal that is supplied to the multiplier 213 and the pulse signal that is supplied to the multiplier 214 are 90 degrees out of phase.

The limiter amplifier 219 amplifies an IF signal output from the multiplier 213 and outputs the amplified IF signal. The limiter amplifier 220 also amplifies an IF signal output from the multiplier 214 and outputs the amplified IF signal. The analog-to-digital converter 221 analog-to-digital converts the analog IF signals output from the limiter amplifiers 219 and 220 into digital data. The baseband processing circuit 222 generates receive data RDT based on digital data obtained by conversion by the analog-to-digital converter 221 and outputs the receive data RDT.

In the receiving unit of the wireless communication apparatus illustrated in FIG. 9B, for example, a detector circuit 223 is coupled between the low noise amplifier 212 and the multipliers 213 and 214, and the detector circuit 223 detects the power of an AC signal that has been output from the low noise amplifier 212 and is to be input to the multipliers 213 and 214. That is, the detector circuit 223 detects the power of an RF signal amplified by the low noise amplifier 212.

In addition, for example, the detector circuit 224 or 225 is coupled between the limiter amplifier 219 or 220 and the analog-to-digital converter 221, and the detector circuit 224 or 225 detects the power of an AC signal that has been output from the limiter amplifier 219 or 220 and is to be input to the analog-to-digital converter 221. That is, the detector circuit 224 detects the power of an IF signal amplified by the limiter amplifier 219, and the detector circuit 225 detects the power of an IF signal amplified by the limiter amplifier 220.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A detector circuit comprising:
   a first inverter including an input node coupled via a first capacitor to a transmission path for transmitting an AC signal, the first inverter outputting an output voltage in accordance with power of the AC signal, wherein the output voltage increases with increasing temperature;
   a second inverter including an input node coupled via a second capacitor to the transmission path, the second inverter outputting an output voltage in accordance with power of the AC signal, wherein the output voltage decreases with increasing temperature;
   a third capacitor including one electrode coupled to either an output electrode of the first inverter or an output node of the second inverter;
   a first resistor coupled between the output node of the first inverter and an output node of the detector circuit; and
   a second resistor coupled between the output node of the second inverter and the output node of the detector circuit.

2. The detector circuit according to claim 1,
   wherein the first resistor and the second resistor have resistances in accordance with a ratio between a variation in the output voltage of the first inverter and a variation in the output voltage of the second inverter relative to temperature change, respectively.

3. The detector circuit according to claim 1,
   wherein the first inverter includes a first P-channel transistor and a first N-channel transistor having a saturation current value smaller than a saturation current value of the first P-channel transistor, and
   wherein the second inverter includes a second P-channel transistor and a second N-channel transistor having a saturation current value greater than a saturation current value of the second P-channel transistor.

4. The detector circuit according to claim 1,
   wherein the input node of the first inverter and the input node of the second inverter are respectively biased to predetermined voltages.

5. The detector circuit according to claim 1, further comprising
   bias circuits that respectively bias the input node of the first inverter and the input node of the second inverter to predetermined voltages.

6. A wireless communication apparatus comprising:
   a power amplifier that amplifies power of an AC signal to be transmitted;
   an antenna that transmits the AC signal input by the power amplifier; and
   a detector circuit that detects power of the AC signal,
   wherein the detector circuit includes
   a first inverter that outputs an output voltage in accordance with power of the AC signal input via a first capacitor, the output voltage increasing with increasing temperature,
   a second inverter that outputs an output voltage in accordance with power of the AC signal input via a second capacitor, the output voltage decreasing with increasing temperature,
   a third capacitor including one electrode coupled to either an output node of the first inverter or an output node of the second inverter,
   a first resistor coupled between the output node of the first inverter and an output node of the detector circuit, and
   a second resistor coupled between the output node of the second inverter and the output node of the detector circuit.

7. The wireless communication apparatus according to claim 6, wherein the detector circuit is coupled between the power amplifier and the antenna.

8. A wireless communication apparatus comprising:
   an antenna;
   an amplifier that amplifies an AC signal received by the antenna;
   a demodulation circuit that detects the AC signal amplified by the amplifier;
   a converter that converts the demodulated AC signal to a digital signal; and
   a detector circuit that that detects power of the AC signal,
   wherein the detector circuit includes
   a first inverter that outputs an output voltage in accordance with power of the AC signal input via a first capacitor, the output voltage increasing with increasing temperature,
   a second inverter that outputs an output voltage in accordance with power of the AC signal input via a second capacitor, the output voltage decreasing with increasing temperature,
   a third capacitor including one electrode coupled to an output node of either an output node of the first inverter or an output node of the second inverter,
   a first resistor coupled between the output node of the first inverter and an output node of the detector circuit, and
   a second resistor coupled between an output node of the second inverter and the output node of the detector circuit.

9. The wireless communication apparatus according to claim 8, wherein the detector circuit is coupled between the amplifier and the demodulation circuit.

10. The wireless communication apparatus according to claim 8, wherein the detector circuit is coupled between the demodulation circuit and the converter.

* * * * *